United States Patent [19]

Toyama et al.

[11] Patent Number: 4,687,727

[45] Date of Patent: * Aug. 18, 1987

[54] LIGHT-SENSITIVE PLANOGRAPHIC PRINTING PLATE WITH LAYER OF DIAZO RESIN CONTAINING PHOTOPOLYMERIZABLE COMPOSITION

[75] Inventors: Tadao Toyama; Kesanao Kobayashi; Mitsuru Koike, all of Shizuoka; Koji Tamoto, Kanagawa, all of Japan

[73] Assignee: Fuji Photo Film Co., Ltd., Kanagawa, Japan

[*] Notice: The portion of the term of this patent subsequent to Apr. 16, 2002 has been disclaimed.

[21] Appl. No.: 774,165

[22] Filed: Sep. 9, 1985

Related U.S. Application Data

[63] Continuation of Ser. No. 534,517, Sep. 21, 1983, abandoned.

[30] Foreign Application Priority Data

Sep. 21, 1982 [JP]  Japan ................................. 57-164435

[51] Int. Cl.⁴ .......................... G03C 1/60; G03C 1/68
[52] U.S. Cl. ..................................... 430/175; 430/156; 430/157; 430/160; 430/162; 430/270; 430/271; 430/281; 430/286; 430/287
[58] Field of Search .............. 430/175, 176, 160, 162, 430/270, 271, 286, 281, 156, 287, 157

[56] References Cited

U.S. PATENT DOCUMENTS

| | | | |
|---|---|---|---|
| 3,376,138 | 4/1968 | Giangualano et al. | 430/302 |
| 3,376,139 | 4/1968 | Giangualano et al. | 430/286 |
| 3,462,267 | 8/1969 | Giangualano et al. | 430/156 |
| 3,556,792 | 1/1971 | Katz | 430/285 |
| 3,556,793 | 1/1971 | Field et al. | 430/285 |
| 3,652,272 | 3/1972 | Thomas | 430/270 |
| 3,796,578 | 3/1974 | Hosoi et al. | 430/280 |
| 3,808,004 | 4/1974 | Thomas et al. | 430/156 |
| 3,825,430 | 7/1974 | Kurka | 430/287 |
| 3,905,815 | 9/1975 | Bonham | 430/156 |
| 3,969,323 | 7/1976 | Furrer et al. | 430/176 |
| 4,123,276 | 10/1978 | Kita et al. | 430/286 |
| 4,233,390 | 11/1980 | Jargiello | 430/273 |
| 4,316,949 | 2/1982 | Petrellis et al. | 430/156 |
| 4,511,645 | 4/1985 | Koike et al. | 430/287 |

FOREIGN PATENT DOCUMENTS

| | | | |
|---|---|---|---|
| 1141544 | 1/1969 | United Kingdom | 430/156 |
| 1274017 | 5/1972 | United Kingdom | 430/156 |
| 2032124 | 4/1980 | United Kingdom | |
| 2044788 | 10/1980 | United Kingdom | 430/175 |

OTHER PUBLICATIONS

Corcoran, C. et al., *Research Disclosure*, Abstract #16767, 3/1978.

*Primary Examiner*—Charles L. Bowers, Jr.
*Attorney, Agent, or Firm*—Sughrue, Mion, Zinn, Macpeak & Seas

[57] ABSTRACT

A light-sensitive planographic printing plate comprising a layer of a photo-polymerizable composition provided on at least one side of a base, wherein said photopolymerizable composition comprises:

(A) a polymer having at least one group represented by the general formula (I)

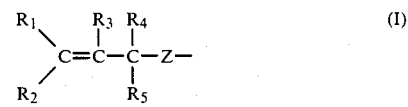

wherein $R_1$ to $R_5$ each represent a member selected from the group consisting of a hydrogen atom, a halgen atom, a carboxyl group, a sulfo group, a nitro group, a cyano group, an amido group, an amino group and a substituted or unsubstituted alkyl group, aryl group, alkoxy gruop, aryloxy group, alkylamino group, arylamino group, alkylsulfonyl group and arylsulfonyl group and Z represents an oxygen atom, a sulfur atom, NH or NR, wherein R represents an alkyl group; and a carboxyl group on the side chain;

(B) a monomer or oligomer having at least two polymerizable ethylenically unsaturated double bonds;

(C) a photo-polymerization initiator, and (D) a diazo resin.

7 Claims, No Drawings

LIGHT-SENSITIVE PLANOGRAPHIC PRINTING PLATE WITH LAYER OF DIAZO RESIN CONTAINING PHOTOPOLYMERIZABLE COMPOSITION

This is a continuation of application Ser. No. 534,517, filed Sept. 21, 1983, abandoned.

FIELD OF THE INVENTION

The present invention relates to a light-sensitive planographic printing plate and, particularly, to a light-sensitive planographic printing plate using a novel photo-polymerizable light-sensitive composition having improved sensitivity-stability in plate making.

BACKGROUND OF THE INVENTION

Attempts to use photo-polymerizable compositions for the light-sensitive image forming layer of a light-sensitive planographic printing plate in the past have not been very successful. For example, a basic composition composed of a polymer as a binder, a monomer and a photo-polymerization initiator, as described in U.S. Pat. No. 3,458,311, a composition in which hardening efficiency is improved by introducing an unsaturated double bond into the polymer used as a binder, as described in U.S. Pat. No. 3,796,578, and compositions using a novel photo-polymerization initiator, as described in U.S. Pat. Nos. 3,549,367 and 3,751,259, and British Pat. No. 1388492 have been used. However, these light-sensitive compositions are disadvantageous in that their sensitivity is greatly influenced by the surface temperature of the light-sensitive planographic printing plate when imagewise exposing to light (hereinafter, this phenomenon is called temperature dependence). That is, the sensitivity under a condition at higher temperature, for example, in summer is sometimes 2 to 8 higher than that under a condition at lower temperature, for example, in winter.

As a result, when the optimum exposure of the light-sensitive planographic printing plate requires, for example, 10 seconds at a plate face temperature of 45° C., satisfactory images can not be obtained by exposing to light at 10° C. for 10 seconds, because 20–80 seconds are required at 10° C. The operation is sometimes carried out early in the morning in winter at 10° C. where there is the possibility that the temperature of the printing frame becomes more than 45° C. when the operation is continuously carried out and the distance from the light source to the plate face is short. Thus, under such conditions, it is absolutely impossible to obtain stabilized images at the same exposure amount.

Further, these photo-polymerizable compositions are disadvantageous in that post-polymerization is caused after exposed to light by residual active seeds to increase the sensitivity with the passage of time before development (hereinafter, this phenomenon is called latent image sensitization).

In the photo-polymerizable compositions disclosed in the above cited patents, there is no exception and the latent image sensitization occurs, that is, the sensitivity after a long passage of time before development sometimes becomes 2 to 8 higher than that just after an exposure. Thus, accumulation of imagewise exposed light-sensitive printing plate is impossible in the plate making operation. This is a serious disadvantage of the light-sensitive planographic printing plates.

It has previously been found that the temperature dependence and the latent image sensitization can be reduced by using a light-polymerizable composition comprising (A) a polymer having at least one group represented by the general formula (I)

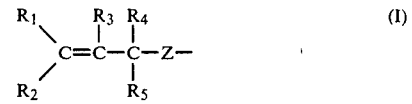

wherein $R_1$ to $R_5$ each represent a member selected from the group consisting of a hydrogen atom, halogen atom, a carboxyl group, a sulfo group, a nitro group, a cyano group, an amido group, an amino group and a substituted or unsubstituted alkyl group, aryl group, alkoxy group, aryloxy group, alkylamino group, arylamino group, alkylsulfonyl group and arylsulfonyl group and Z represents an oxygen atom, a sulfur atom, NH or NR, wherein R represents an alkyl group, and a carboxyl group on the side chain, (B) a monomer or oligomer having at least two polymerizable ethylenically unsaturated double bonds, and (C) a photo-polymerization initiator.

It has now been found that improved sensitivity-stability in plate making operations, can be achieved when the above described photo-polymerizable composition is combined with a diazo resin.

SUMMARY OF THE INVENTION

The object of the present invention is to achieve improved sensitivity-stability has been met in one embodiment by a light-sensitive planographic printing plate comprising a layer of a photo-polymerizable composition provided on at least one side of a base, wherein the photo-polymerizable composition comprises:

(A) a polymer having at least one group represented by the general formula (I)

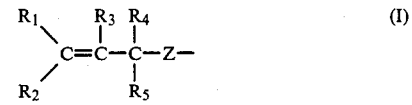

wherein $R_1$ to $R_5$ each represent a member selected from the group consisting of a hydrogen atom, a halogen atom, a carboxyl group, a sulfo group, a nitro group, a cyano group, an amido group, an amino group and a substituted or unsubstituted alkyl group, aryl group, alkoxy group, aryloxy group, alkylamino group, arylamino group, alkylsulfonyl group and arylsulfonyl group, and Z represents an oxygen atom, a sulfur atom, NH or NR, wherein R represents an alkyl group; and a carboxyl group on the side chain, (B) a monomer or oligomer having at least two polymerizable ethylenically unsaturated double bonds, (C) a photo-polymerization initiator, and (D) a diazo resin.

In another embodiment, the present invention relates to a light-sensitive planographic printing plate comprising a diazo resin layer provided on at least one side of a base and a layer of a photo-polymerizable composition adjacent to said diazo resin layer, wherein the photo-polymerizable composition comprises (A) a polymer having at least one group represented by the general formula (I)

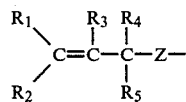

wherein $R_1$ to $R_5$ each represent a member selected from the group consisting of a hydrogen atom, a halogen atom, a carboxyl group, a sulfo group, a nitro group, a cyano group, an amido group, an amino group and a substituted or unsubstituted alkyl group, aryl group, alkoxy group, aryloxy group, alkylamino group, arylamino group, alkylsulfonyl group and arylsulfonyl group, and Z represents an oxygen atom, a sulfur atom, NH or NR, wherein R represents an alkyl group; and a carboxyl group on the side chain,
(B) a monomer or oligomer having at least two polymerizable ethylenically unsaturated double bonds, and
(C) a photo-polymerization initiator.

In still another embodiment, the present invention relates to a light-sensitive planographic printing plate comprising a diazo resin layer provided on at least one side of a base and a layer of a photo-polymerizable composition adjacent to said diazo resin layer, wherein the photo-polymerizable composition comprises:
(A) a polymer having at least one group represented by the general formula (I)

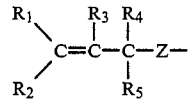

wherein $R_1$ to $R_5$ each represent a member selected from the group consisting of a hydrogen atom, a halogen atom, a carboxyl group, a sulfo group, a nitro group, a cyano group, an amido group, an amino group and a substituted or unsubsituted alkyl group, aryl group, alkoxy group, aryloxy group, alkylamino group, arylamino group, alkylsulfonyl group and arylsulfonyl group, and Z represents an oxygen atom, a sulfur atom, NH or NR, wherein R represents an alkyl group; and a carboxyl group on the side chain,
(B) a monomer or oligomer having at least two polymerizable ethylenically unsaturated double bonds,
(C) a photo-polymerization initiator, and
(D) a diazo resin.

DETAILED DESCRIPTION OF THE INVENTION

Compositions in which a photo-polymerizable composition is combined with a diazo resin are known. For example, British Pat. No. 2,044,788, teachs a photo-reactive composition composed of a photo-polymerizable composition containing an unsaturated compound capable of causing free radical polymerization in which a diazo resin soluble in organic solvents is homogeneously contained, and a material which has a coating layer of a water soluble diazo resin provided on an aluminium face under a coating layer of the above described photo-reactive composition (hereinafter, referred to undercoat layer). Further, it is known to use of a prepolymer capable of cross-linking itself, such as polyacryl isophthalate as a binder.

However, the above described patent application relates to a composition for photo-reactive printing plates capable of developing with pure water which further contains a water-softenable polymer soluble in organic solvents. There is no description concerning the function of the diazo resin, except image formation. Further, the prepolymer such as polyacryl isophthalate is added as a binder polymerizable by heating after exposing to light, which is essentially different from polymer (A) used in the present invention.

U.S. Pat. No. 4,316,949 describes a diazonium resin soluble in organic solvents and a photo-polymerizable composition containing an ethylenically unsaturated oligomer which contains the diazonium resin, with a water soluble diazonium resin used for the undercoat layer. However, the diazonium resin is only described as being used for improving developability.

U.S. Pat. No. 3,905,815, teaches a light-sensitive planographic printing plate in which an undercoat layer of a diazo resin is provided on a base having a hydrophilic surface and a photo-polymerizable layer is provided on the undercoat layer. However, there is no description that temperature dependence or latent image sensitization is improved by the layer construction.

On the contrary, in the present invention, it has been found out that the temperature dependence and the latent image sensitization can be reduced by adding a diazo resin to a specific phot-polymerizable composition containing the above described polymer (A) or by applying a diazo resin as an undercoat layer of the specific photopolymerizable composition layer. Accordingly, the composition and the effect of the present invention are quite different from those of known compositions.

In the present invention, the diazo resin may be mixed with the photo-polymerizable compsition containing components (A)–(C) or may be used for undercoating, or may be used in combination. By these compositions, the temperature dependence is effectively reduced. It is preferable to mix the diazo resin with the photo-polymerizable composition.

The diazo resin is selected from those which are soluble in organic solvents when it is added to the photo-polymerizable composition. The diazo resin is selected from both of those which are soluble in water and those which are soluble in organic solvents when it is used for undercoating.

The diazo resins used in the present invention, which have been used hitherto for negative type light-sensitive planographic printing plates, are reaction products of a condensation product with an anion. The condensation product is prepared by condensing a diazo monomer such as 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine or 3-(isopropoxy)-4-diazodiphenylamine with a condensing agent such as formaldehyde, acetaldehyde, propionaldehyde, butylaldehyde, isobutylaldehyde or benzaldehyde in a molar ratio of 1:1 to 1:0.5, preferably 1:0.8 to 1:0.6, by a conventional process, with an anion.

Water soluble diazo resins are obtained by selecting chlorine ion or tetrachlorozincic acid as an anion.

Diazo resins soluble in organic solvents are obtained by selecting tetrafluoroboric acid, hexafluorophosphoric acid, triisopropylnaphthalenesulfonic acid, 4,4'-biphenyldisulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzenesulfonic acid or p-toluenesulfonic acid, etc. as an anion. Among these, 2-methoxy-4-hydroxy-5-benzoylbenzenesulfonic acid is particularly preferred.

The preferred amount of the diazo resin to be used when homogeneously blending it with the photopolymerizable composition containing components (A)–(C) is in a range of 1 to 30% by weight, preferably 5 to 20% by weight, based on the total amount of the photo-polymerizable composition.

On the other hand, the preferred coating amount of the diazo resin to be used in an undercoating is in a range of 0.01 to 1 g/m², preferably 0.1 to 0.5 g/m².

The base used in the present invention is a dimensionally stabilized plate. Examples of such dimensionally stabilized plates include a base for prior printing plates, which can be suitably used in the present invention, i.e. papers, papers laminated with plastics (for example, polyethylene, polypropylene or polystyrene, etc.), metal plates such as aluminium (including aluminium alloy), zinc or copper, etc., films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal, etc., and papers or plastic films laminated with or coated by vacuum evaporation with the above described metal, etc. Among these bases, an aluminium plate is particularly preferred because it has remarkable dimensional stability and is cheap. Further, a composite sheet in which an aluminium sheet is bonded to a polyethylene terephthalate film, as described in British Pat. No. 1,329,714 is preferred.

Furthermore, when the base has a metal face, particularly aluminium, it is preferred that the base is subjected to surface treatment such as graining, immersion in an aqueous solution of sodium silicate, potassium fluorozirconate or phosphoric acid salt, etc. or anodic oxidation, etc. Moreover, an aluminium plate which is subjected to immersion treatment in an aqueous solution of sodium silicate after graining and an aluminium plate which is subjected to immersion treatment in an aqueous solution of alkali metal silicate after treated by anodic oxidation, as described in U.S. Pat. No. 3,181,461, are suitably used.

The above described anodic oxidation treatment is carried out by sending an electric current through the aluminium plate as an anode in an electrolyte solution comprising one or more of aqueous or nonaqueous solutions of an inorganic acid such as phosphoric acid, chromic acid, sulfuric acid or boric acid, etc., an organic acid such as oxalic acid or sulfamic acid, etc. or salts thereof.

Silicate electrode position described in U.S. Pat. No. 3,658,662 is also effective.

Bases subjected to electrolytic graining and those subjected to a surface treatment consisting of a combination of the above described anodic oxidation treatment and the sodium silicate treatment, as described in U.S. Pat. Nos. 3,891,516 and 4,087,341 are useful.

Bases subjected to brush graining, electrolytic graining, anodic oxidation treatment and sodium silicate treatment in turn, as described in British Pat. No. 2,047,274 are also suitable.

These treatments for producing hydrophilicity also prevents a harmful reaction with the light-sensitive composition provided thereon and improve adhesion with the light-sensitive layer.

Polymer (A) used in the present invention is characterized in that it has unsaturated groups with are represented by the general formula (I)

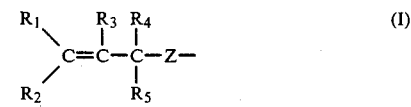

wherein $R_1$ to $R_5$ each represent a member selected from the group consisting of a hydrogen atom, a halogen atom, a carboxyl group, a sulfo group, a nitro group, a cyano group, an amido group, an amino group and a substituted or unsubstituted alkyl group, aryl group, alkoxy group, aryloxy group, alkylamino group, arylamino group, alkylsulfonyl group and arylsulfonyl group, and Z represents an oxygen atom, a sulfur atom, NH or NR, wherein R represents an alkyl group.

Compositions using a binder containing unsaturated groups are known and described in U.S. Pat. No. 3,796,578, etc., but compositions having improved temperature dependence and latent image sensitization have not been known.

The alkyl group in $R_1$ to $R_5$ in the above described general formula (I) may be a straight chain, branched chain or cyclic alkyl group, which is preferred to have 1 to 7 carbon atoms. The alkyl group may have substituents such as alkoxy groups having 1 to 2 carbon atoms, alkoxycarbonyl groups having 1 to 3 carbon atoms, a phenyl group or a hydroxyl group, etc.

The aryl group in $R_1$ to $R_5$ may be a phenyl group and a furyl group, which may have substituents such as halogen atoms (for example, a chlorine atom or a bromine atom, etc.), a hydroxyl group, alkyl groups having 1 to 7 carbon atoms, aryl groups (for example, phenyl or methoxyphenyl, etc.), alkoxy groups having 1 to 7 carbon atoms, a nitro group, an amino group or N,N-dialkylamino groups, etc.

The alkoxy group in $R_1$ to $R_2$ may have 1 to 7 carbon atoms. The aryloxy group may be a phenyloxy group which has substituents such as an alkyl group or an alkoxy group having 1 to 7 carbon atoms.

The alkylamino group in $R_1$ to $R_5$ may have 1 to 15 carbon atoms.

The arylamino group may be a phenylamino group or a naphthylamino group.

The alkylsulfonyl group in $R_1$ to $R_5$ may have 1 to 15 carbon atoms.

The arylsulfonyl group may be a phenylsulfonyl group which has substituents such as alkyl groups having 1 to 15 carbon atoms, alkoxy groups having 1 to 5 carbon atoms or amino group, etc.

Polymer (A) used in the present invention is described in U.S. Pat. Nos. 3,376,138, 3,556,792 and 3,556,793, but it is only disclosed for producing light cross-linking resists, which is clearly different from the present invention in which they are used as a binder in the photo-polymerizable composition.

The synthesis of polymer (A) is roughly classified into the following two processes:

Process A: A process which comprises reacting a body polymer having carboxylic acid, carboxylic acid halide or carboxylic acid anhydride groups as side chains with a compound represented by the following formula (I-a):

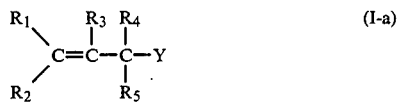

wherein $R_1$ to $R_5$ are defined as in the general formula (I), and Y represents —OH, —SH, —NH$_2$, —NHR, wherein R represents an alkyl group or a halogen atom, to introduce unsaturated groups represented by the formula

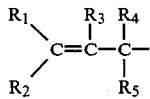

wherein $R_1$ to $R_5$ are defined as above in the general formula (I), through the linking group of

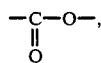

—COS—, —CONH— or —CONR—.

Process B: A process which comprises copolymerizing a monomer having an unsaturated group represented by the above described general formula (I) and an ethylenically unsaturated group, which has a higher addition-polymerization reactivity than the above described unsaturated group, with an unsaturated carboxylic acid to obtain the polymer (A).

In Process A, examples of the body polymer include copolymers of acrylic acid or methacrylic acid and acid halogenized copolymers prepared by a high polymer reaction of the above described copolymers. Further, copolymers of maleic acid anhydride or itaconic acid anhydride, etc. can be used as the body polymer.

Examples of comonomers to be copolymerized in Process A include styrene and alkyl substituted derivatives thereof, alkyl acrylates, aryl acrylates, alkyl methacrylates, aryl methacrylates and aliphatic vinyl esters. Preferred examples include copolymers of acrylic acid or methacrylic acid and methyl acrylate, ethyl acrylate, butyl acrylate, benzyl acrylate, methyl methacrylate, ethyl methacrylate, butyl methacrylate or benzyl methacrylate, etc.

In order to introduce the unsaturated groups into the above copolymers, the unsaturated alcohol, amine, thiol or halogenide represented by the general formula (I-a) is blended with the copolymer and dissolved in a reaction solvent under conventional reaction conditions. The mixture is heated in the presence of a reaction catalyst and a polymerization inhibitor.

In Synthesis Example 1 below, a copolymer of methacrylic acid and benzyl methacrylate is employed.

SYNTHESIS EXAMPLE 1

To a 300 ml three neck flask equipped with a stirring bar, a stirring blade, a reflux condenser and a thermometer, 19.8 g of poly(methacrylic acid/benzyl methacrylate:molar ratio of 27/73), 40.2 g of ethylene glycol monomethyl ether acetate as a reaction aolvent, 6.0 g of allyl bromide as the chemical containing the unsaturated group, 10.4 g of trimethylbenzyl ammonium hydroxide as the catalyst and 0.01 g of p-methoxyphenol as the polymerization inhibitor were added. The mixture was dissolved and stirred at 70° C. under a nitrogen atmospher for 13 hours. After the mixture was cooled to 25° C., methyl ethyl ketone was added and the separated quaternary salt was removed. Methanol was then added so as to dilute the mixture. Next, the diluted mixture was poured into diluted hydrochloric acid to form a precipitate. The precipitate was washed with water and then filtered out by suction and dried in a vacuum. The yield of the polymer was 13.6 g. The allyl group introduced was 35% with respect to carboxylic acid in the body polymer. The intrinsic viscosity was 0.161 in methyl ethyl ketone solution at 30° C.

Introduction of the unsaturated groups into maleic acid anhydride copolymers can be carried out by the process described in U.S. Pat. No. 2,047,398. That is, the maleic acid anhydride parts are cleaved so that the unsaturated ester, amide or thioester, etc. is introduced.

A process for introducing the unsaturated groups into the maleic acid anhydride copolymers is described for example in U.S. Pat. No. 3,905,820. However, compounds according to this process are obviously different from the above described polymers and are distinguished from polymer (A) used in the present invention in that the unsaturated group is linked to the nitrogen atom of maleic acid imide.

In Process B, monomers containing at least two carbon-carbon double bonds having the above described unsaturated group are synthesized by a condensation reaction of alcohol, amine, thiol or halogenide having the unsaturated group with unsaturated carboxylic acid, preferably acrylic acid or methacrylic acid by known methods. The resulted monomers containing at least two unsaturated groups are copolymerized with an unsaturated carboxylic acid, preferably acrylic acid or methacrylic acid to obtain copolymers having the unsaturated groups. As copolymerizable monomers, other monomers may be copolymerized in addition to the unsaturated carboxylic acid. Examples of such monomers include alkyl methacrylates, alkyl acrylates, benzyl methacrylate, 2-hydroxyethyl methacrylate and acrylonitrile, etc.

In Synthesis Examples below, copolymerization of allyl methacrylate and methacrylic acid is described. (For an analogous process, see U.S. Pat. No. 2,047,398.)

SYNTHESIS EXAMPLE 2

In a 3 l four-necked flask equipped with a stirrer bar and a stirring blade, a reflux condenser, a dropping funnel and a thermometer, 1.68 l of 1,2-dichloroethane was added as a reaction solvent and heated to 70° C. in a nitrogen atmosphere. A solution prepared by dissolving 100.8 g of allyl methacrylate, 7.6 g of methacrylic acid and 1.68 g of the polymerization initiator: 2,2'-azobis-(2,4-dimethylvaleronitrile) in 0.44 l of 1,2-dichloroethane was placed in a dropping funnel and the mixed solution was added dropwise to the flask for over 2 hours with stirring.

After conclusion of the dropwise addition, the mixture was stirred at a reaction temperature of 70° C. for 5 hours to complete the reaction. Thereafter, 0.04 g of p-methoxyphenol was added as a polymerization inhibitor and the reaction solution was concentrated to 500 ml. The resulted concentrated solution was added to 4 l of hexane in order to form a precipitate. After drying in a vacuum, 61 g (yield: 56%) of a copolymer was obtained. The intrinsic viscosity was $[\eta]=0.068$ in methyl ethyl ketone solution at 30° C.

Examples compounds represented by general formula (I-a) include allyl alcohol, 2-methyl-allyl alcohol, crotyl alcohol, 3-chloro-2-propene-1-ol, 3-phenyl-2-propene-1-ol, 3-(hydroxyphenyl)-2-propene-1-ol, 3-(2-hydroxyphenyl)-2-propene-1-ol, 3-(3,4-dihydroxyphenyl)-2-propene-1-ol, 3-(2,4-dihydroxyphenyl)-2-propene-1-ol, 3-(3,4,5-trihydroxyphenyl)-2-propene-1-ol, 3-(3-methoxy-4-hydroxyphenyl)-2-propene-1-ol, 3-(3,4-dihydroxy-5-methoxyphenyl)-2-propene-1-ol, 3-(3,5-dimethoxy-4-hydroxyphenyl)-2-propene-1-ol, 3-(2-hydroxy-4-methylphenyl)-2-propene-1-ol, 3-(4-methoxyphenyl)-2-propene-1-ol, 3-(4-ethoxyphenyl)-2-propene-1-ol, 3-(2-methoxyphenyl)-2-propene-1-ol, 3-(3,4-dimethoxyphenyl)-2-propene-1-ol, 3-(3-methoxy-4-propoxyphenyl)-2-propene-1-ol, 3-(2,4,6-trimethoxyphenyl)-2-propene-1-ol, 3-(3-methoxy-4-benzyloxyphenyl)-2-propene-1-ol, 3-(3-(3'-methoxyphenyl)-4-benzyloxyphenyl)-2-propene-1-ol, 3-phenoxy-3-phenyl-2-propene-1-ol, 3-(3,4,5-trimethoxyphenyl)-2-propene-1-ol, 3-(4-methylphenyl)-2-propene-1-ol, 3-phenyl-3-(2,4,6-trimethylphenyl)-2-propene-1-ol, 3,3-(di-(2,4,6-trimethylphenyl))-2-propene-1-ol, 3-phenyl-3-(4-methylphenyl)-2-propene-1-ol, 3,3-diphenyl-2-propene-1-ol, 3-(2-chlorophenyl)-2-propene-1-ol, 3-(3-chlorophenyl)-2-propene-1-ol, 3-(4-chlorophenyl)-2-propene-1-ol, 3-(2,4-dichlorophenyl)-2-propene-1-ol, 3-(2-bromophenyl)-2-propene-1-ol, 3-bromo-3-phenyl-2-propene-1-ol, 3-chloro-3-phenyl-2-propene-1-ol, 3-(4-nitrophenyl)-2-propene-1-ol, 3-(2-nitrophenyl)-2-propene-1-ol, 3-(3-nitrophenyl)-2-propene-1-ol, 2-methyl-3-phenyl-2-propene-1-ol, 2-methyl-3-(4-chlorophenyl)-2-propene-1-ol, 2-methyl-3-(4-nitrophenyl)-2-propene-1-ol, 2-methyl-3-(4-aminophenyl)-2-propene-1-ol, 2-methyl-3,3-diphenyl-2-propene-1-ol, 2-ethyl-1,3-diphenyl-2-propene-1-ol, 2-ethoxymethylene-3-phenyl-2-propene-1-ol, 2-phenoxy-3-phenyl-2-propene-1-ol, 2-methyl-3-(4-methoxyphenyl)-2-propene-1-ol, 2,3-diphenyl-2-propene-1-ol, 1,2,3-triphenyl-2-propene-1-ol, 2,3,3-triphenyl-2-propene-1-ol, 2-ethoxy-3-phenyl-2-propene-1-ol, 1,3-diphenyl-2-propene-1-ol, 1-(4-methylphenyl)-3-phenyl-2-propene-1-ol, 1-phenyl-3-(4-methylphenyl)-2-propene-1-ol, 1-phenyl-3-(4-methoxyphenyl)-2-propene-1-ol, 1-(4-methoxyphenyl)-3-phenyl-2-propene-1-ol, 1,3-di(4-chlorophenyl)-2-propene-1-ol, 1-(4-bormophenyl)-3-phenyl-2-propene-1-ol, 1-phenyl-3-(4-nitrophenyl)-2-propene-1-ol, 1,3-di(2-nitrophenyl)-2-propene-1-ol, 1-(4-dimethylaminophenyl)-3-phenyl-2-propene-1-ol, 1-phenyl-3-(4-dimethylaminophenyl)-2-propene-1-ol, 1,1-di(4-dimethylaminophenyl)-3-phenyl-2-propene-1-ol, 1,1,3-triphenyl-2-propene-1-ol, 1,1,3,3-tetraphenyl-2-propene-1-ol, 1-(4-methylphenyl)-3-phenyl-2-propene-1-ol, 1-(dodecylsulfonyl)-3-phenyl-2-propene-1-ol, 1-phenyl-2-propene-1-ol, 1,2-diphenyl-2-propene-1-ol, 1-phenyl-2-methyl-2-propene-1-ol, 1-cyclohexyl-2-propene-1-ol, 1-phenoxy-2-propene-1-ol, 2-benzyl-2-propene-1-ol, 1,1-di(4-chlorophenyl)-2-propene-1-ol, 1-carboxy-2-propene-1-ol, 1-carboxiamido-2-propene-1-ol, 1-cyano-2-propene-1-ol, 1-sulfo-2-propene-1-ol, 2-ethoxy-2-propene-1-ol, 2-amino-2-propene-1-ol, 3-(3-amino-4-methoxyphenylsulfonyl)-2-propene-1-ol, 3-(4-methylphenylsulfonyl)-2-propene-1-ol, 3-phenylsulfonyl-2-propene-1-ol, 3-benzylsulfonyl-2-propene-1-ol, 3-anilinosulfonyl-2-propene-1-ol, 3-(4-methoxyanilinosulfonyl)-2-propene-1-ol, 3-anilino-2-propene-1-ol, 3-naphthylamino-2-propene-1-ol, 3-phenoxy-2-propene-1-ol, 3-(2-methylphenyl)-2-propene-1-ol, 3-(3-methylphenoxy)-2-propene-1-ol, 3-(2,4-dimethylphenyl)-2-propene-1-ol, 1-methyl-3-carboxy-2-propene-1-ol, 3-carboxy-2-propene-1-ol, 3-bromo-3-carboxy-2-propene-1-ol, 1-carboxy-3-chloro-3-methyl-2-propene-1-ol, 1-carboxy-3-methyl-2-propene-1-ol, 1-(2-carbethoxyisopropyl)-3-methyl-2-propene-1-ol, 1-(1-carbethoxypropyl)-2-propene-1-ol, 1-(1-carbethoxyethyl)-3-methyl-2-propene-1-ol, 1-carbethoxy-3-chloro-3-methyl-2-propene-1-ol, 1-carbethoxymethylene-3-methyl-2-propene-1-ol, 1-amido-2,3-dimethyl-2-propene-1-ol, 1-cyano-3-methyl-2-propene-1-ol, 3-sulfo-2-propene-1-ol, 3-butoxy-2-propene-1-ol, 1-cyclohexyl-3-(2-hydroxycyclohexyl)-2-propene-1-ol, 3-cyclopentyl-2-propene-1-ol, 3-furyl-2-propene-1-ol, 3-chloro-2-propene-1-ol, 3-bromo-2-propene-1-ol, 2-methyl-3-chloro-2-propene-1-ol, 2-methyl-3-bromo-2-propene-1-ol, 1-carboisobutoxy-3-chloro-3-methyl-2-propene-1-ol, 2-chloro-3-phenyl-2-propene-1-ol (2-chlorocinnamyl alcohol), 2-bromo-3-phenyl-2-propene-1-ol (2-bromocinnamyl alcohol), 2-bromo-3-(4-nitrophenyl)-2-propene-1-ol, 2-fluoro-3-phenyl-2-propene-1-ol (2-fluorocinnamyl alcohol), 2-fluoro-3-(4-methoxyphenyl)-2-propene-1-ol, 2-nitro-3-chloro-3-phenyl-2-propene-1-ol, 2-nitro-3-phenyl-2-propene-1-ol (2-nitrocinnamyl alcohol), 2-cyano-3-phenyl-2-propene-1-ol (2-cyanocinnamyl alcohol), 2-chloro-2-propene-1-ol (2-chloroallyl alcohol), 2-bromo-2-propene-1-ol (2-bromoallyl alcohol), 2-carboxy-2-propene-1-ol (2-carboxyallyl alcohol), 2-carbethoxy-2-propene-1-ol (2-carbethoxyallyl alcohol), 2-sulfo-2-propene-1-ol (2-sulfoallyl alcohol), 2-nitro-2-propene-1-ol (2-nitroallyl alcohol), 2-bromo-3,3-difluoro-2-propene-1-ol, 2-chloro-3,3-difluoro-2-propene-1-ol, 2-fluoro-3-chloro-2-propene-1-ol, 2,3-dibromo-3-carboxy-2-propene-1-ol, 2,3-diiodo-3-carboxy-2-propene-1-ol, 2,3-dibromo-2-propene-1-ol and 2-chloro-3-methyl-2-propene-1-ol. It is also possible to use compounds in which alcohol in the 1-position in the above described example is substituted with a thioalcohol group, an amine group or a halogen atom.

Preferred ranges of the unsaturated group content and the carboxylic acid monomer content in polymer (A) are 10 to 90% by mol and 5 to 60% by mol, preferably 20 to 70% by mol and 10 to 40% by mol, respectively.

Examples of the unsaturated monomers of component (B) in the photo-polymerizable composition of the present invention include compounds having at least one addition-polymerizable unsaturated group. Particularly preferred examples of such compounds include ethylene glycol diacrylate (and dimethacrylate), polyethylene glycol diacrylate (and dimethacrylate), trimethylolethane triacrylate (and trimethacrylate), trimethylolpropane triacrylate (and trimethacrylate), neopentyl glycol diacrylate (and dimethacrylate), tri-, tetra- and hexaacrylates(and tri-, tetra- and hexamethacrylates) of pentaerythritol and dipentaerythritol, epoxydiacrylate (and dimethacrylate), oligo acrylate described in Japanese Patent Publication No. 7361/77, and acrylurethane resin and acrylurethane oligomer described in Japanese Patent Publication No. 41708/73, etc.

It is preferred that the ratio by weight of these monomers or oligomers to polymer (A) is in a range of 1:9 to 7:3, preferably 1:3 to 1:1.

Examples of the photo-polymerization initiator component (C) include vicinal-polyketaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, aromatic acyloin compounds substituted with α-hydrocarbons disclosed in U.S. Pat. No. 2,722,512, polynuclear quinone compounds disclosed in U.S. Pat. Nos. 3,046,127 and 2,951,758, combinations of triarylimidazole dimer/p-aminophenyl ketone disclosed in U.S. Pat. No. 3,549,367, benzothiazole compounds disclosed in U.S. Pat. No. 3,870,524, benzothiazole compounds/trihalomethyl-s-triazine compounds disclosed in U.S. Pat. No. 4,239,850, acridine and phenazine compounds disclosed in U.S. Pat. No. 3,751,259, and oxadiazole compounds disclosed in U.S. Pat. No. 4,212,970, etc.

The amount of component (C) employed in the present invention is in a range of about 0.5% by weight to about 15% by weight, preferably 2 to 10% by weight based on the total weight of the photo-polymerizable composition.

In addition to the above described substances, it is preferred to add a thermal polymerization inhibitor. For example, it is preferred to use hydroquinone, p-methoxyphenol, di-t-butyl-p-cresol, pyrogallol, t-butyl-catechol, bezoquinone, 4,4'-thiobis(3-methyl-6-t-butyl-phenol), 2,2'-methylenebis(4-methyl-6-t-butylphenol) and 2-mercaptobenzimidazole, etc. If necessary, it is possible to add dyes or pigments in order to color the light-sensitive layer or to add a pH indicator as a print-out agent.

The photo-polymerizable composition as described above is dissolved in a suitable solvent such as 2-methoxyethanol, 2-methoxyethyl acetate, cyclohexane, methyl ethyl ketone or ethylenedichloride, etc. or in a mixture composed of a suitable combination of the above described solvents and is provided on a base.

The coating amount of the composition after drying is preferred to be in a range of about 0.1 g/m$^2$ to about 10 g/m$^2$, preferably 0.5 to 5 g/m$^2$.

It is preferred to provide a protective layer composed of a polymer having an excellent oxygen intercepting property on the layer of the photo-polymerizable composition provided on the base. Examples of such polymers include: polyvinyl alcohol or acid celluloses, etc. This protective layer is used to prevent polymerization inhibiting action caused by oxygen in the air. The method of applying such a protective layer has been described in, for example, U.S. Pat. No. 3,458,311 and British Pat. No. 1,441,339 in detail.

In order to produce a planographic printing plate with the light-sensitive planographic printing plate of the present invention, the light-sensitive planographic printing plate is first imagewise exposed to light using a light source rich in ultraviolet rays, such as a metal halide lamp or a high-pressure mercury lamp, etc. Next, it is treated with a developing solution to remove the nonexposed parts of the light-sensitive layer. Finally, a gum liquor is applied to produce a planographic printing plate.

Preferred examples of the above described developing solution include alkaline aqueous solutions containing a small amount of organic solvent such as benzyl alcohol, 2-phenoxyethanol or 2-butoxyethanol, examples of which are described in U.S. Pat. Nos. 3,475,171 and 3,615,480. In addition, developing solutions described in Japanese Patent Application No. (OPI) 26601/75 and Japanese Patent Publication No. 39464/81 and U.S. Pat. No. 4,186,006 are excellent for developing the light-sensitive printing plate of the present invention.

The present invention is illustrated in greater detail in the following excepts which are in one way meant to limit the present invention. All % are by weight.

EXAMPLE 1

A base was obtained by a process described in British Pat. No. 2,047,274. That is, the surface of an aluminium plate having a thickness of 0.30 was grained with a nylon brush and an aqueous dispersion of 400 mesh pumice. Thereafter, the aluminium plate was washed with water. The plate was then etched by immersing in 10% sodium hydroxide at 70° C. for 60 seconds. Next, the plate was washed with running water and neutralized with 20% HNO$_3$ and again washed with water. Then the plate was subjected to an electrolytic roughing treatment using 160 coulombs/dm$^2$ of electricity in a 1% aqueous solution of nitric acid with a sine wave alternating electric current, $V_A = 12.7$ V. When the surface roughness was measured, it was 0.6μ (Ra indication). Subsequently, the plate was desmutted at 55° C. for 2 minutes by immersing it in a 30% aqueous solution of H$_2$SO$_4$ and then subjected to an anodic oxidation treatment at an electric density of 2 A/dm$^2$ in a 20% aqueous solution of H$_2$SO$_4$ for 2 minutes so as to result in a thickness of 2.7 g/m$^2$. Thereafter, the plate was immersed in a 2.5% aqueous solution of sodium silicate at 70° C. for 1 minute, followed by washing with water and drying.

Then, light-sensitive solution (1) was prepared.

Light-sensitive solution (1):

| | |
|---|---|
| Pentaerythritol tetraacrylate | 200 g |
| Poly(allyl methacrylate/methacrylic acid) Copolymer having a copolymerization molar ratio of 85/15 | 300 g |
| 2-Trichloromethyl-5-(p-n-butoxystyryl)-1,3,4-oxadiazole | 24 g |
| 2-Methoxy-4-hydroxy-5-benzoylbenzensulfonic acid salt of a condensation product of 4-diazodiphenylamine and formaldehyde | 70 g |
| Oil Blue #603 (produced by Orient Chemical Industry Co.) | 10 g |
| Ethylene glycol monomethyl ether | 2000 g |
| Methyl alcohol | 700 g |
| Methyl ethyl ketone | 1300 g |

The poly(allyl methacrylate/methacrylic acid) was synthesized by the following process. In a 3 l four-necked flask equipped with a stirring bar and a stirring blade, a reflux condenser, a dropping funnel and a thermometer, 1.68 l of 1,2-dichloroethane was placed as a reaction solvent and heated to 70° C. in a nitrogen atmosphere. A solution prepared by dissolving 100.8 g of allyl methacrylate 7.6 g of methacrylic acid and 1.68 g of the polymerization initiator: 2,2'-azobis(2,4-dimethylvaleronitrile) in 0.44 l of 1,2-dichloroethane was placed in a dropping funnel and the mixed solution was added dropwise to the flask with stirring for over 2 hours.

After conclusion of the dropwise addition, the mixture was stirred at a reaction temperature of 70° C. for 5 hours to complete the reaction. Next, 0.04 g of p-methoxyphenol was added and the reaction solution was concentrated to 500 ml. The resulted concentrated solution was added to 4 l of hexane to form a precipitate. After drying in vacuum, 61 g (yield: 56%) of a copolymer was obtained. The viscosity was $[\eta]=0.068$ in a methyl ethyl ketone solution at 30° C.

The light-sensitive solution (1) was filtered and applied to the above described base by a revolving coater so as to result in a weight of 2.5 g/m² after drying. The drying was carried out at 100° C. for 2 minutes.

Then, a 3% aqueous solution of polyvinyl alcohol (viscosity: 5.3±0.5 cps in a 4% aqueous solution (20° C.) by a Hopler viscometer; saponification value: 86.5–89.0% by mol; degree of polymerization: less than 1000) was applied to the surface of the above described light-sensitive layer so as to result in a weight of 1.0 g/m² after drying. The resulted light-sensitive planographic printing plate has been designated as Sample A.

As a comparative example, a light-sensitive solution (2) has prepared having the same composition as that of the light-sensitive solution (1), except that the diazo resin: 2-methoxy-4-hydroxy-5-benzoylbenzene sulfonic acid salt of a condensation product of 4-diazodiphenylamine and formaldehyde was not used. This solution was applied and dried in the same manner as described above. Further, a polyvinyl alcohol layer was provided as above to produce Sample B.

In order to compare the temperature dependence of these samples, a Fuji PS step guide (gray scale in which transmission density discontinuously varied at $\Delta D=0.15$) produced by Fuji Photo Film Co. and a UGRA-GRETAG plate control wedge (PCW) were laid on each sample. These samples were exposed to light bu a Berkey printer (light source 24×28, 2 kW vacuum printer). The exposure was carried out by controlling the temperature of the printing frame of the printer at 10° C. and 50° C. Just after exposure, the samples were immersed in the following developing solution for 50 seconds, and thereafter the surface was softly rubbed to remove nonexposed parts.

Developing solution:

| Sodium sulfite | 5 g |
| Benzyl alcohol | 30 g |
| Sodium carbonate | 5 g |
| Sodium isopropylnaphthalenesulfonate | 12 g |
| Purified water | 1000 g |

When the step number of the step guide on the plate after development was examined, a difference between the step number at 10° C. and that at 50° C. (namely, sensitivity) was scarcely observed in Sample A as shown in Table 1.

Further, when fine papers were printed using these printing plates with a commercially available ink by means of a printer KOR produced by Heidelberg Co., the tone of the prints did not change between 10° C. and 50° C. in Sample A, while the prints showed a dot-gaining at 50° C. than at 10° C. in Sample B. When they were compared with the UGRA-GRETAG plate control wedge, dot-gaining of the prints at 50° C. was 2% larger than that at 10° C. in step number 6 (half-tone dots area: 45%).

TABLE 1

| | Temperature dependence | |
|---|---|---|
| Sample | Difference of step number of step guide between an exposure temperature of 10° C. and that of 50° C. | Variation of dot area of PCW step number 6 between an exposure temperature of 10° C. and that of 50° C. |
| A | 1 step | less than 1% |
| B | 3 steps | 2% |

In order to compare latent image sensitization, the samples were exposed to light while keeping the temperature of the printing frame of the printer at 15° C. The difference of the step number of the step guide and variation of the half-tone dots area of PCW between when developing just after exposure and when developing after passage of 1 hour were examined. These results are shown in Table 2. The latent image sensitization was more reduced in Sample A containing the diazo resin.

TABLE 2

| | Latent image sensitization | |
|---|---|---|
| Sample | Difference of step number of step guide between when developing just after exposure and when developing after passage of 1 hour | Variation of dot area of PCW step number 6 when developing just after exposure and when developing after passage of 1 hour |
| A | 0 | 0% |
| B | 1 step | 0.5–1% |

EXAMPLE 2

Light-sensitive planographic printing plates: Samples C, D and E were obtained by the same manner as in Example 1, respectively, except that the following polymer c, d or e was used in the light-sensitive solution 1 instead of poly(allyl methacrylate/methacrylic acid).
c. Poly(cinnamyl methacrylate/methacrylic acid)
  (Molar ratio of copolymerization: 89.5/10.5)
d. Poly(crotonyl methacrylate/methacrylic acid)
  (Molar ratio of copolymerization: 83.3/16.7)
e. Poly(methallyl methacrylate/methacrylic acid)
  (Molar ratio of copolymerization: 83.5/16.5)

When the temperature dependence and the latent image sensitization of these samples were evaluated according to the methods shown in Example 1, good results, as shown in Table 3, were obtained.

TABLE 3

| | Temperature dependence (10° C.–50° C.) | | Latent image sensitization (0–1 hour) | |
|---|---|---|---|---|
| Sample | Difference of step guide | Variation of dot area | Difference of step guide | Variation of dot area |
| C | 1–2 steps | 1.2% | 0.5 steps | 0.5% |
| D | 1–2 steps | 1.5% | 0.5 steps | 0.5% |
| E | 1–2 steps | 1.2% | 0.5 steps | 0.5% |

EXAMPLE 3

An undercoating solution having the following composition was prepared and applied to the surface of the base described in Example 1 by a nip roller so as to result in a coating amount of about 0.2 g/m² after drying.

Undercoating solution:

| | |
|---|---|
| Tetrachlorozincate of a condensation product of 4-diazodiphenylamine and formaldehyde | 10 g |
| Purified water | 1000 g |

To the resulted undercoat layer, the light-sensitive solutions (1) and (2) in Example 3 were applied by the same manner, and a polyvinyl alcohol layer was provided to obtain Samples F and G, respectively.

The temperature-dependence and the latent image sensitization of these samples are shown in Table 4. The results demonstrate that they are superior than when no undercoat layer (Sample B) is provided.

TABLE 4

| Sample | Temperature dependence (10° C.-50° C.) | | Latent image sensitization (0-1 hour) | |
|---|---|---|---|---|
| | Difference of step guide | Variation of dot area | Difference of step guide | Variation of dot area |
| F | 1 step | less than 1% | 0 step | 0% |
| G | 1-2 steps | 1.2% | 0.5 steps | 0.5% |

While the invention has been described in detail and with reference to specific embodiment thereof, it will be apparent to one skilled in the art that various changes and modifications can be made therein without departing from the spirit and scope thereof.

What is claimed is:

1. A light-sensitive planographic printing plate comprising a layer of a photo-polymerizable composition provided on at least one side of a base, wherein said photo-polymerizable composition is soluble in an organic solvent and comprises in admixture:

(A) a polymer which is a copolymer of methacrylic acid and a monomer having an unsaturated group represented by the general formula (I)

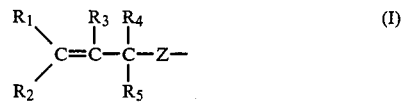

wherein $R_1$ to $R_5$ each represent a member selected from the group consisting of a hydrogen atom, a halogen atom, a carboxyl group, a sulfo group, a nitro group, a cyano group, an amido group, an amino group and a substituted or unsubstituted alkyl group, aryl group, alkoxy group, aryloxy group, alkylamino group, arylamino group, alkylsulfonyl group and arylsulfonyl group and Z represents an oxygen atom, a sulfur atom, NH or NR, wherein R represents and alkyl group; wherein said monomer is selected from the group consisting of allyl methacrylate, cinnamoyl methacrylate, crotonyl methacrylate and methallyl methacrylate, and wherein the monomer content and the methacrylic acid content in said polymer are 10 to 90% by mol and 5 to 60% by mol, respectively;

(B) a monomer or oligomer having at least two polymerizable ethylenically unsaturated bonds;

(C) a photo-polymerization initiator; and (D) a diazo resin soluble in organic solvents and which is the reaction product of a condensate product with an anion, wherein said diazo resin (D) is homogenously blended with components (A)-(C) in an amount of from 1-30% by weight based on the total amount of the photo-polymerizable composition, wherein the weight ratio of component (B) to polymer (A) is in the range of from 1:9 to 7:3 and wherein the amount of component (C) employed is from about 0.5% by weight to about 15% by weight based on the total weight of the photo-polymerizable composition.

2. The light-sensitive planographic printing plate as in claim 1 wherein said diazo resin (D) is homogeneously blended with components (A)-(C) in an amount of from 5-20% of weight based on the total amount of the photo-polymerizable composition.

3. The light-sensitive planographic printing plate as in claim 1 wherein the weight ratio of component (B) to polymer (A) is in the range of from 1:3 to 1:1.

4. The light-sensitive planographic printing plate as in claim 1 wherein the amount of components (C) employed is from about 2 to about 10% by weight based on the total weight of the photo-polymerizable composition.

5. The light-sensitive planographic printing plate as in claim 1 where the said photo-polymerizable composition is coated on said base in an amount of from 0.1 to 10 g/m².

6. The light-sensitive planographic printing plate as in claim 1 wherein the said photo-polymerizable composition is coated on said base in an amount of from 0.5 to 5 g/m².

7. A light-sensitive planographic printing plate as claimed in claim 1, wherein the monomer content and the methacrylic acid content in said polymer are 20 to 70% by mol and 10 to 40% by mol, respectively.

* * * * *